(12) United States Patent
Shih

(10) Patent No.: US 6,409,523 B1
(45) Date of Patent: Jun. 25, 2002

(54) TERMINAL LEGS OF CONNECTORS

(75) Inventor: Hsiao-Lei Shih, Taipei (TW)

(73) Assignee: Jess-Link Products Co., Ltd., Taipei (TW)

( * ) Notice: Subject to any disclaimer, the term of this patent is extended or adjusted under 35 U.S.C. 154(b) by 0 days.

(21) Appl. No.: 09/891,657

(22) Filed: Jun. 27, 2001

(51) Int. Cl.[7] ................................................ H01R 9/09
(52) U.S. Cl. ........................................... 439/83; 439/79
(58) Field of Search ................................ 439/76, 78–83

(56) References Cited

U.S. PATENT DOCUMENTS

| | | | |
|---|---|---|---|
| 4,978,307 A | * 12/1990 | Billman et al. | 439/83 |
| 5,076,795 A | * 12/1991 | Krupp et al. | 439/79 |
| 5,078,611 A | * 1/1992 | Tanigawa et al. | 439/83 |
| 5,238,412 A | * 8/1993 | Morishita et al. | 439/79 |
| 5,731,958 A | * 3/1998 | Kozel | 439/83 |
| 6,081,996 A | * 7/2000 | Kruppa et al. | 439/83 |

* cited by examiner

Primary Examiner—Hien Vu
(74) Attorney, Agent, or Firm—Jacobson Holman, PLLC

(57) ABSTRACT

A connector with a plurality of slots for incorporating terminals. The rear legs of the terminals are secured onto the circuit board. The legs of the terminals are molded as having a contact column and a contact plate, with the contact plate at the lateral side of the contact column. The contact column goes through the through contact of the circuit board and is soldered to the circuit board. The contact plate is attached to the surface contact of the circuit board and secured by SMD. In case SMD is not able to secure the contact plate to the circuit board, soldering can be used instead.

2 Claims, 4 Drawing Sheets

TERMINAL LEGS OF CONNECTORS

BACKGROUND OF THE INVENTION

I. Field of the Invention

This invention relates generally to an improved structure of terminal legs for a connector and, more specifically, to terminal legs for a connector which is molded into a contact column and a contact plate and can be secured onto the circuit board by means of soldering or SMD (surface mounting device).

II. Description of the Prior Art

Heretofore, it is known to construct a computer connector (a) having a plurality of L-shaped terminals (b) at the rear side, as shown in FIG. 4. Each L-shaped terminal (b) of such construction typically has a contact column (b1) that goes through the through contact (c1) of the circuit board (c) and is soldered onto the circuit board (c). To solder the terminal (b) of the connector (a) to the circuit board (c) typically results in a large volume of the connector.

It is also known to construct a terminal of a computer connector having a contact plate secured on the surface contact of the circuit board by means of SMD, as shown in FIG. 5. A connector (a) of this kind is typically connected to a plurality of Z-shaped terminals (d), with each terminal (d) having a contact plate (d1) secured to the surface contact (c2) of the circuit board (c) by means of SMD.

Although it is fast and convenient to secure the contact plate (d1) of the Z-shaped terminals (d) to the circuit board (c) by SMD, when some contact plate (d1) of the Z-shaped terminals (d) have bad contact with the circuit board (c), it cannot be fixed and the connector has to be discarded.

The present invention improves on the heretofore known connector terminals by providing a connector having a plurality of slots for incorporating one end of the terminals. The other ends of the terminals are to be attached to the circuit board. The leg of each terminal is molded into a contact column and a contact plate, with the contact plate residing at the lateral side of the contact column. The contact column goes through the through contact of the circuit board and is soldered onto the circuit board. The contact plate is secured on the surface contact of the circuit board by means of SMD. Based on the structure described above, the legs of the terminals can be soldered onto the circuit board in case that SMD fails to secure the legs onto the circuit board.

SUMMARY OF THE INVENTION

It is therefore a primary object of the invention to provide a terminal for a connector with a contact column and a contact plate, which can be secured onto the circuit board by soldering or SMD.

BRIEF DESCRIPTION OF THE DRAWINGS

An embodiment of the invention will now be described by way of example only, with reference to the accompanying drawing, in which.

DESCRIPTION OF THE PREFERRED EMBODIMENT

Figure 1:
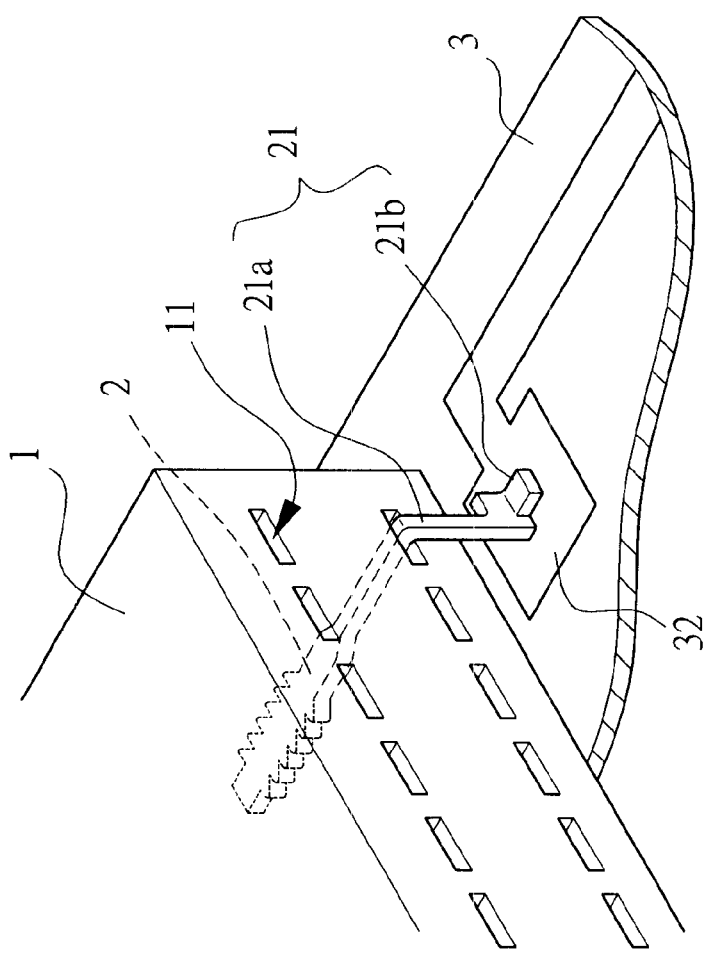
FIG. 1 is an elevational view of the present invention.
Figure 2:
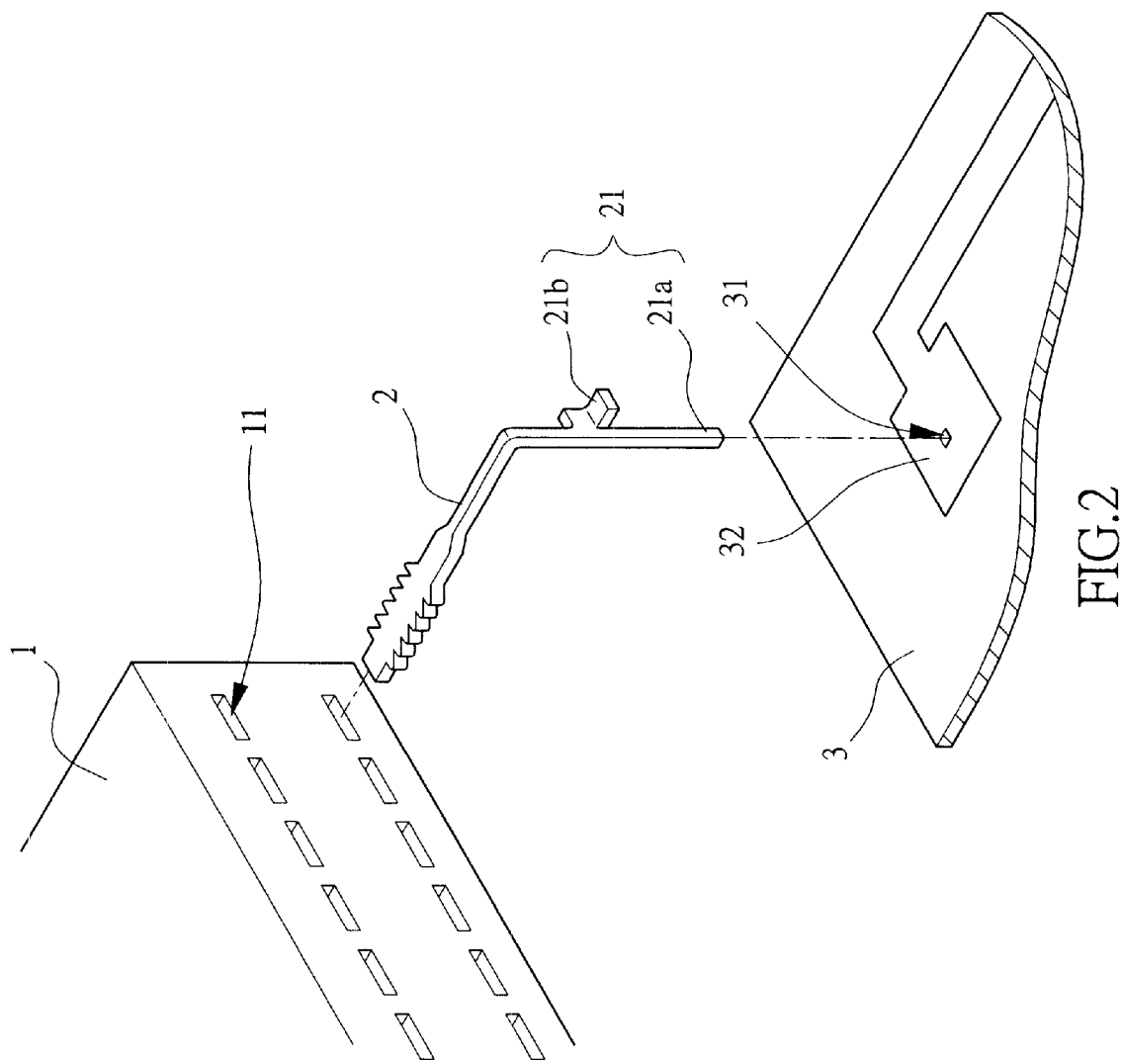
FIG. 2 is a fragmentary elevational view of the present invention.

Referring to FIG. 1 and FIG. 2, the present invention comprises a connector 1 having a plurality of slots 11 for incorporating terminals 2. The legs 21 at the other end of the terminals 2 are connected to the circuit board 3.

Figure 3:
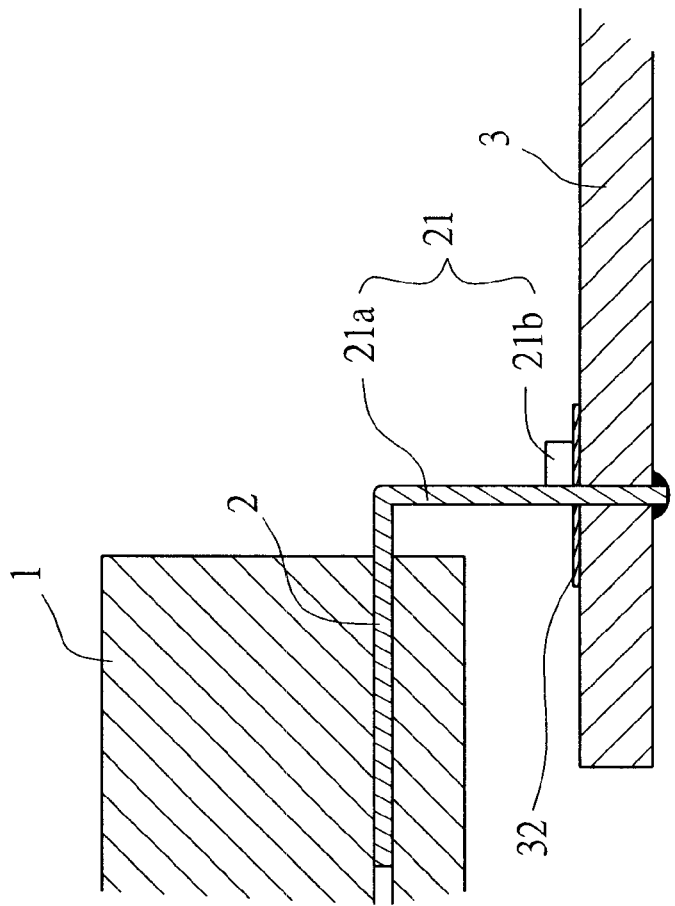
FIG. 3 is a sectional view of the present invention.
Figure 4:
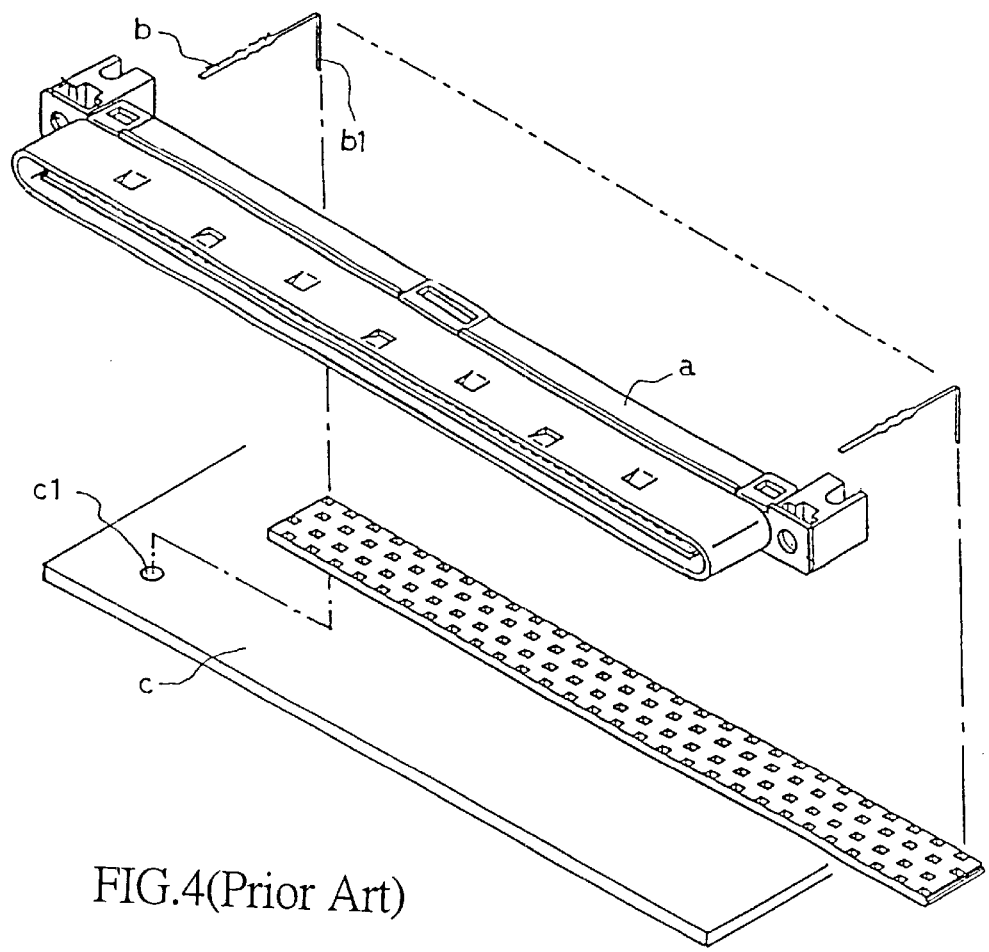
FIG. 4 is a fragmentary elevational view of a conventional structure of terminals for connectors.
Figure 5:
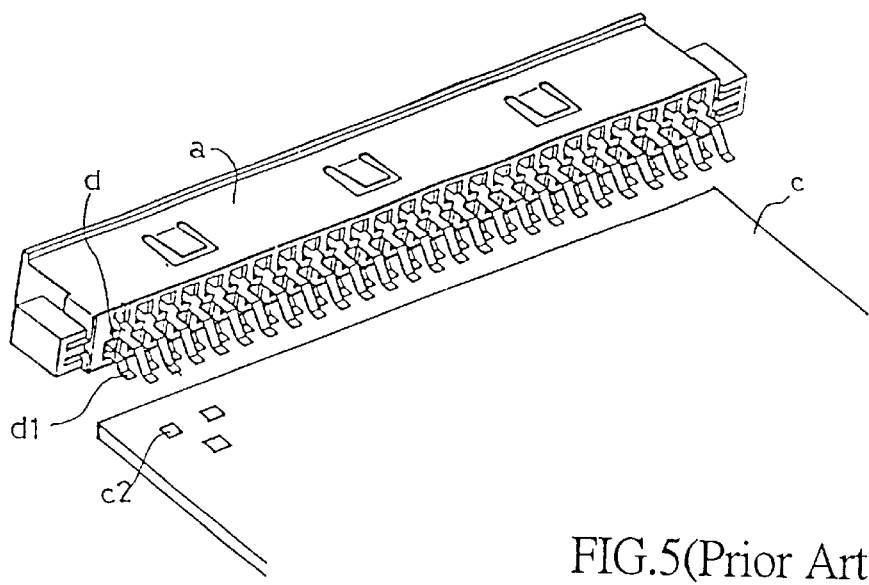
FIG. 5 is a fragmentary elevational view of another conventional structure of terminals for connectors.

The leg 21 of each terminal 2 is molded into a contact column 21a and a contact plate 21b, where the contact plate 21b resides at the lateral side of the contact column 21a. The contact column 21a goes through the through contact 31 of the circuit board 3 and is soldered onto the circuit board 3. The contact plate 21b reaches the surface contact 32 of the circuit board 3 and is secured onto the circuit board 3 by means of SMD, as shown in FIG. 3.

Based on the structure demonstrated above, the leg 21 of the terminal 2 consists of a contact column 21a and a contact plate 21b, where the contact column 21a goes directly through the through contact 31 of the circuit board 3, and the contact plate 21b is secured to the surface contact 32 of the circuit board 3 by means of SMD. Since the through contact 31 and the surface contact 32 shares the same contact, the contact column 21a can be soldered to the circuit board 3 on the through contact 31 in case that some contact plate 21b of the terminals 2 cannot maintain an adequate contact with the circuit board 3 by means of SMD.

On the other hand, in case that some contact column 21a of the terminals 2 are not adequately soldered to the circuit board 3, the contact plate 21b can be used as a substitute, connecting to the surface contact 32 of the circuit board 3 by means of SMD.

While a preferred embodiment of the invention has been shown and described in detail, it will be readily understood and appreciated that numerous omissions, changes and additions may be made without departing from the spirit and scope of the invention.

What is claimed is:

1. An assembly connector comprising a connector, a circuit board and a plurality of terminals having two ends, said connector having a plurality of slots forming two rows, one above the other, one end of said terminals having teeth on both sides thereof and being secured in one of said slots, a leg at the other end of said terminals being connected to said circuit board, said leg of each said terminal including a contact column and a contact plate having two portions; one portion of said contact plate being located at a lateral side of said contact column in a plane of said contact column and the other portion of said contact plate extending perpendicularly to said one portion of said contact plate, out of the plane of said contact column, so that when said contact column extends through a hole in said circuit board and said contact column is soldered onto said circuit board at a bottom surface of said circuit board, said other portion of said contact plate engages a surface contact at an upper surface of said circuit board and is secured onto said circuit board by soldering.

2. A terminal for interconnecting a connector having a plurality of slots forming two rows, one above the other, and a circuit board having a plurality of holes and a surface contact surrounding each of said holes, said terminal comprising:

two ends,
one of said two ends being securable in one of said plurality of slots of said connector and the other of said two ends being securable in one of said plurality of holes in said circuit board,
said other of said two ends including a contact column and a contact plate, said contact plate having two portions, one of said two portions of said contact plate extending from a lateral side of said contact column in a plane of said contact column and the other portion of said contact plate extending forwardly of said one portion of said contact plate, out of the plane of said contact column, so that when said contact column extends through one of said plurality of holes of said circuit board and said contact column is soldered onto a bottom surface of said circuit board, said other portion of said contact plate engages said surface contact at an upper surface of said circuit board and is secured to said circuit board.

* * * * *